United States Patent
Gotsick et al.

(10) Patent No.: US 7,152,529 B2
(45) Date of Patent: *Dec. 26, 2006

(54) SYSTEM FOR THERMAL DEVELOPMENT OF FLEXOGRAPHIC PRINTING PLATES

(76) Inventors: Timothy Gotsick, 1681 Kenbrook Trace, Acworth, GA (US) 30101; Gary T. Markhart, 2904 Corte Celeste, Carlsbad, CA (US) 92009

( * ) Notice: Subject to any disclaimer, the term of this patent is extended or adjusted under 35 U.S.C. 154(b) by 0 days.

This patent is subject to a terminal disclaimer.

(21) Appl. No.: 11/297,725

(22) Filed: Dec. 8, 2005

(65) Prior Publication Data

US 2006/0081142 A1 Apr. 20, 2006

Related U.S. Application Data

(62) Division of application No. 10/837,107, filed on Apr. 30, 2004, now Pat. No. 7,044,055.

(51) Int. Cl.
   *B41N 6/00* (2006.01)
   *G03F 7/00* (2006.01)
(52) U.S. Cl. ................... 101/401.1; 430/306
(58) Field of Classification Search ............ 101/401.1, 101/483, 463.1; 430/306, 309, 330, 348, 430/413
See application file for complete search history.

(56) References Cited

U.S. PATENT DOCUMENTS

| | | |
|---|---|---|
| 3,264,103 A | 8/1966 | Cohen et al. |
| 4,176,162 A | 11/1979 | Stern |
| 4,414,003 A | 11/1983 | Blaudszun |
| 4,473,380 A | 9/1984 | Voliva et al. |
| 5,175,072 A | 12/1992 | Martens |
| 5,279,697 A | 1/1994 | Peterson et al. |
| 5,564,337 A | 10/1996 | Uehara et al. |
| 6,245,129 B1 | 6/2001 | Yoshikawa |
| 6,797,454 B1 | 9/2004 | Johnson et al. |
| 2003/0180655 A1 | 9/2003 | Fan et al. |
| 2003/0211423 A1 | 11/2003 | Mengel et al. |
| 2005/0084791 A1 | 4/2005 | Hackler et al. |

FOREIGN PATENT DOCUMENTS

WO   WO 01/18604 A2   3/2001

*Primary Examiner*—Ren Yan
(74) *Attorney, Agent, or Firm*—Carmody & Torrance LLP

(57) ABSTRACT

The present invention is directed to a method and a system for forming a relief image on a photosensitive printing element. The system comprises an enclosure housing a conveyor and a heatable roller. The photosensitive printing element is positioned on a continuous loop of the conveyor and the heatable roller is urged towards the photosensitive printing element on the conveyor. An absorbent material is conducted over the heatable roller and is used to absorb at least a portion of the liquefied or softened material from the photosensitive printing element when the heatable roller is heated. The system also comprises ventilation means operatively connected to the enclosure for treating and recycling air containing contaminants that are released into the enclosure as the portion of the photosensitive material is heated and then softens. The ventilation means typically include a particulate filter and a bed of adsorbent material. The treated air may then be returned to the enclosure.

18 Claims, 1 Drawing Sheet

SYSTEM FOR THERMAL DEVELOPMENT OF FLEXOGRAPHIC PRINTING PLATES

This application is a divisional application of application Ser. No. 10/837,107, filed Apr. 30, 2004, now U.S. Pat. No. 7,044,055, which is herein incorporated by reference in its entirety.

FIELD OF THE INVENTION

The present invention is a closed loop vapor control system that is usable with a device for thermal development of flexographic printing elements.

BACKGROUND OF THE INVENTION

Systems for thermal development of flexographic printing plates are well known in the prior art. A typical system for thermal development of flexographic printing plates comprises a plate processor that accepts a previously formed and imagewise actinic radiation exposed flexible sheet. The flexible sheet typically has a base layer and one or more adjacent layers of a radiation hardenable elastomer material (curable layer). Optionally, the flexible sheet may comprise an infrared sensitive layer.

U.S. Pat. No. 5,175,072 to Martens, the subject matter of which is herein incorporated by reference in its entirety, describes a method for forming, irradiating, and thermally developing a flexographic sheet to manufacture a flexographic printing plate. Thermal development plate processors are further described in U.S. Pat. No. 5,279,697 to Peterson et al., and in WO 01/18604 to Johnson et al., the subject matter of each of which is herein incorporated by reference in its entirety. The plate processor described by Johnson et al. is similar to the plate processor described by Peterson et al.

Prior to using the plate processor to thermally develop the flexible sheet to form the flexographic printing plate, the flexographic printing plate is subjected to an imaging step. In a typical imaging step, a template or mask is first placed over the radiation curable layer, which is imagewise exposed to actinic radiation to harden (cure or crosslink) a portion of the radiation curable layer. Alternatively, the infrared sensitive layer may be ablated by an infrared laser to create an in situ mask on the radiation curable layer. A portion of the radiation curable layer is then cured by actinic radiation through the lower surface of the base to form a cured "floor." Next, the radiation curable layer film is imagewise exposed from the opposite surface to cure the desired portions of the plate. The radiation curable layer after curing consists of cured portions and uncured portions. At this point, the flexible sheet may be developed in the thermal plate processor.

The development of the relief structure formed during the imaging step is accomplished by removal of the uncured portions of the radiation curable layer. The radiation curable layer is contacted with a preheated web of absorbent material. The heat in the absorbent web is transferred to the radiation curable layer upon contact, and the temperature of the radiation curable layer is raised to a temperature sufficient to enable the uncured portions of the radiation curable layer to soften or liquefy and be absorbed into the absorbent web. While still in the heated condition, the absorbent sheet material is separated from the cured radiation curable layer in contact with the support layer to reveal the relief structure. After cooling to room temperature, the resulting flexographic printing plate can be mounted on a printing plate cylinder.

Thermal plate processors routinely reach temperatures in excess of 150° C. during removal of uncrosslinked portions of the radiation curable layer. At this temperature, the monomers and polymers that make up the plate can volatilize.

Thus, there is a need in the art for an improved ventilation system for a thermal plate processor that can treat vapors resulting from the removal of uncrosslinked portions of the radiation curable layer of the flexographic printing plate.

The inventors have developed an improved ventilation system that is operably connected to a suitable plate processor and that operates in a "closed loop." The improved ventilation system of the invention exhausts contaminated air from the plate processor, filters the contaminated air to remove the contaminants, and returns the treated air to the plate processor.

SUMMARY OF THE INVENTION

The present invention is directed to a system for forming a relief image on a photosensitive printing element, wherein the photosensitive printing element comprises a flexible substrate and at least one layer of photosensitive material deposited on the flexible substrate The system on the invention generally comprises:

an enclosure;

a conveyor comprising a continuous loop supported by at least a first roller and a second roller, wherein the photosensitive printing element is positioned on the continuous loop of the conveyor;

a heatable roller capable of being urged towards the photosensitive printing element positioned on the conveyor, wherein an absorbent material is conducted over at least a portion of an outer surface of the heatable roller, and wherein the absorbent material is capable of absorbing material that is liquefied or softened from the photosensitive printing element when the heatable roller is heated and rotates and the absorbent material contacts at least a portion of the photosensitive printing element;

delivery means for supplying the absorbent material to at least the portion of the outer surface of the heatable roller;

means for causing the at least one layer of photosensitive material and the absorbent material to come into contact at a point between the conveyor and the heatable roller such that at least a portion of the liquefied or softened material is absorbed by the absorbent material; and ventilation means operatively connected to the enclosure for treating and recycling air containing volatile organic compounds in the enclosure, wherein the volatile organic compounds are released into the enclosure as the portion of the photosensitive material is heated and then liquefies or softens.

In a preferred embodiment, the ventilation means comprises means for exhausting a flow of air containing the volatile organic compounds and other contaminants from the enclosure; a particulate filter for removing particulates from the flow of air; means for adsorbing volatile organic compounds from the flow of air to produce a purified stream of air; and means for recycling the purified flow of air back into the enclosure. Optionally, the ventilation means further comprises means for controlling the temperature of the flow of air containing the volatile organic compounds introduced into the ventilation means from the enclosure.

In another optional but preferred embodiment, the system may comprise heating means positioned adjacent to a point where the absorbent material contacts the at least one layer of photosensitive material on the conveyor to further soften and/or liquefy portions of the at least one layer of photosensitive material.

A method of forming a relief image on a photosensitive printing element, wherein the photosensitive printing element comprises a flexible substrate and at least one layer of photosensitive material deposited on the flexible substrate using the system of the invention is also contemplated.

DETAILED DESCRIPTION OF THE PREFERRED EMBODIMENTS OF THE INVENTION

Figure 1:
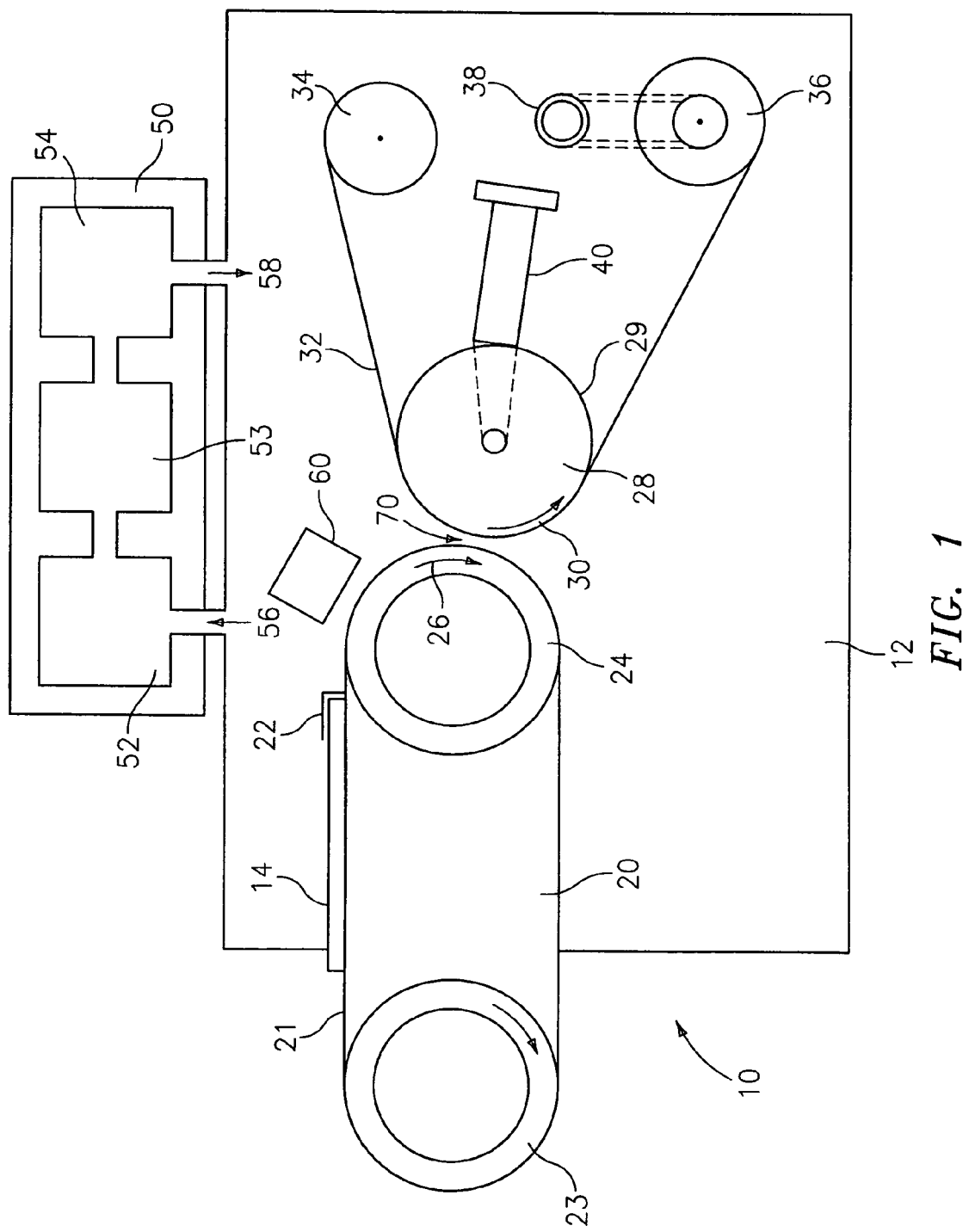
FIG. 1 depicts one view of a plate processor operatively connected to a closed loop ventilation system in accordance with one embodiment of the present invention.

As depicted in FIG. 1, the present invention is directed to a system 10 for forming a relief image on a photosensitive printing element 14. The system 10 of the invention comprises an enclosure 12 for housing the elements of the thermal plate processing system 10 operatively connected to a ventilation system 50 for treating and recycling contaminated air from the enclosure 12.

The plate processor 10 of the invention accepts a previously formed and imagewise actinic radiation exposed flexible photosensitive printing element 14, the photosensitive printing element 14 having a base layer, an adjacent layer of a radiation hardenable elastomer material (curable layer), and optionally, but preferably, an infrared sensitive layer which is used to form an in situ mask on the curable layer using laser radiation prior to exposure to actinic radiation. Suitable photosensitive printing elements usable in the invention are described in U.S. Pat. No. 5,175,092 to Martens, U.S. Pat. Nos. 5,262,275 and 6,238,837 to Fan, and U.S. Pat. Nos. 5,925,500 and 6,605,410 to Yang et al., the subject matter of each of which is herein incorporated by reference in its entirety.

A portion of the radiation curable layer is preferably cured by actinic radiation through the lower surface of the base to form a cured "floor." Next, the film is imagewise exposed from the opposite surface to cure the desired portions of the plate, preferably through the in situ mask. The remaining portion of the radiation curable layer after curing consists of cured portions and uncured portions.

A conveyor 20 attached to a drive motor (not shown) is used to transport and convey the photosensitive printing element 14 through the thermal plate processing system. The conveyor 20 is mounted in a fixed position in the enclosure 12, and comprises a continuous loop 21 supported by at least a first roller 23 and a second roller 24. Optionally, one or more additional rollers (not shown) may be used to provide additional support to the conveyor 20 and prevent the continuous loop 21 from sagging from the weight of the photosensitive printing element 14. In a preferred embodiment, the continuous loop 21 comprises wire mesh.

The leading edge of the photosensitive printing element 14 may be held in place against the continuous loop 21 of the conveyor 20 by suitable fastening means 22, such as a clamp and/or vacuum. If desired, a vacuum may be provided to at least one of the first roller 23 and the second roller 24 of the conveyor 20, and used, alone or in combination with fastening means 22, to hold the photosensitive printing element 14 in place on the continuous loop 21 of the conveyor 20.

During operation, the conveyor 20 with photosensitive printing element 14 moves in a first direction 26 towards heatable roller 28 such that the photosensitive printing element 14 passes through a gap 70 between the conveyor 20 and the heatable roller 28 as the continuous loop 21 of conveyor 20 rotates over and around the second roller 24. Heatable roller 28 rotates in an opposite direction 30 from the conveyor 20. Heatable roller 28 is capable of being urged towards the photosensitive printing element 14 positioned on the conveyor 20 as the conveyor moves in first direction 26 and heatable roller 28 moves in an opposite direction 30. Preferably, the heatable roller 28 is fixably mounted on a pivot (not shown), which allows it to be urged towards the conveyor 20.

In a preferred embodiment, the heatable roller 28 is urged toward the photosensitive printing element 14 on the conveyor 20 using suitable means, such as one or more pneumatic cylinders 40. The pneumatic cylinder(s) 40 positions the heatable roller 28 at a preset distance from the outer surface of the second roller 24 of the conveyor 20 to produce the gap 70 through which the photosensitive printing element 14 passes as it travels on the continuous loop 21 of the conveyor 20 around the second roller 24.

A web of absorbent material 32 is conducted over at least a portion of an outer surface 29 of the heatable roller 28. The web of absorbent material 32 is capable of absorbing (removing) material that is liquefied or softened from the photosensitive printing element 14 when the heatable roller 28 rotates and is heated and the web of absorbent material 32 contacts at least a portion of the photosensitive printing element 14. The heatable roller 28 rotates in a direction 30 opposite to the direction 26 of the conveyor 20 so that the photosensitive printing element 14 and the web of adsorbent material 32 can be contacted with each other and then separated.

The pneumatic cylinder 40 is controlled to adjust the gap 70 depending on the thickness of the photosensitive printing element 14. The pneumatic cylinder(s) 40 causes the at least one layer of photosensitive material 14 and the web of absorbent material 32 to come into contact at the gap 70 between the conveyor 20 and the heatable roller 28 as the conveyor 20 rotates in a first direction 26 and the heatable roller 28 rotates in an opposite direction 30 such that at least a portion of the liquefied or softened material is absorbed by the web of absorbent material 32.

Heat is provided to the heatable roller 28 by a core heater that is capable of maintaining a skin temperature of the heatable roller 28 that will soften or liquefy at least a portion of the photosensitive material. The temperature to which the heatable roller 28 is heated is chosen based on the composition of the photosensitive material and is based on the melting temperature of the monomers and polymers contained within the photosensitive material. Although the heatable roller 28 preferably comprises an electrical core heater to provide the desired skin temperature, the use of steam, oil, hot air, and a variety of other heating sources may also provide the desired skin temperature.

The web of absorbent material 32 is supplied to at least the portion of the outer surface of the heatable roller 28 from a supply roll 34 of the web of absorbent material 32. The specific type of absorbent material is not critical to the present invention. The selection of the absorbent material 32 depends in part upon the thickness of the photosensitive printing element 14 to be processed, the melting temperature of the web of absorbent material 32, and the heat transfer characteristics of both the photosensitive printing element 14 and the web of absorbent material 32.

The web of absorbent material 32 comes into face-to-face contact with the heatable roller 28, which in the preferred embodiment is heated to and operated at a temperature between about 150° C. and about 250° C. The upper limit is determined in large part by the melting temperature of the web of absorbent material 32. The temperature of the heatable roller 28 must also be low enough so that when the web of absorbent material 32 is not moving and the portions of the web of absorbent material 32 contacting the heatable roller 28 are at rest, the absorbent material 32 does not melt. Suitable means for maintaining uniform tension in the web of absorbent material throughout the system may be used, including for example, one or more idler rollers (not shown). Other means for maintaining tension in the web may also be provided and would be known to those skilled in the art.

It is also critical that the linear speed of the heatable roller 28, the web of absorbent material 32, and the photosensitive printing element 14 be substantially the same to avoid any shear stress on the photosensitive printing element 14, which stress is known to cause uneven relief portion plate thickness.

In a preferred embodiment, a take-up roller 36 is provided for winding the web of absorbent material 32 after processing through the plate processor. If present, the take-up roller 36 is independently belt driven by a motor 38, which is preferably a variable speed motor. The take-up roller 36 collects the web of adsorbent material 32 after it has contacted the photosensitive printing element 14 and removed portions of the photosensitive material that were liquefied or softened. The speed of the motor 38 is adjusted so as to not interfere with the selected web tension. If the motor interferes with web tension, the resulting flexographic plate could potentially have variable heights in the relief portions or might warp and be commercially unacceptable.

The system further comprises ventilation means 50 operatively connected to the enclosure 12 for treating and recycling air in the enclosure 12 that contains volatile organic compounds, particulates, and other contaminants. Volatile organic compounds and other contaminants are typically released into the enclosure 12 as the portion of the photosensitive material 14 is heated and then liquefies or softens. In addition, contaminants may be released into the enclosure 12 as the photosensitive printing element 14 is processed through the plate processor 10.

Ventilation means 50 typically comprises means 56 for exhausting a flow of air containing the volatile organic compounds and other contaminants from the enclosure 12 into the ventilation means 50. One suitable means 56 for exhausting a flow of air from the enclosure 12 is an exhaust fan, although the invention is not limited to the use of an exhaust fan. Other suitable means would also be known to those skilled in the art.

After the flow of air is exhausted from the enclosure 12 to the ventilation means 50, the air is directed to a filtering system. The filtering system generally contains a particulate filter 53 for removing any suspending particle or droplets and an adsorbent bed of material 54 that removes organic vapors. In a preferred embodiment, the particulate filter comprises a high efficiency particulate air (HEPA) filter to remove particulates from the flow of air.

Next, volatile organic compounds are removed from the flow of air by passing the flow of air over a bed of adsorbent material 54 to remove the volatile organic compounds from the flow of air and produce a purified stream of air. The adsorbent material is typically selected from the group consisting of activated carbon, charcoal, alumina, zeolites, and combinations of the foregoing. Other adsorbent materials that are capable of removing volatile organic compounds and other contaminants from the air stream may also be used in the practice of the invention.

In an optional, but preferred embodiment, once the air containing the volatile organic compounds and other contaminants is exhausted from the enclosure 12 to the ventilation means 50, the temperature of the flow of air containing the contaminants is controlled using suitable temperature control means 52. Controlling the temperature of the flow of air precipitates contaminants and leads to improve removal of contaminants by the filtering system. Controlling the temperature of the flow of air also limits the tendency for vapors to escape. In a preferred embodiment, the temperature control means 52 comprises a heat exchanger or a heat pump, although other means would also be known to those skilled in the art.

Finally, purified air is recycled back into the enclosure 12 using suitable means 58, or alternately, may be released to the environment. In a preferred embodiment, a blower is used to recycle the purified air back into the enclosure 12.

In another preferred embodiment, at least a portion of the flow of air that is removed from the enclosure 12 is used to provide a vacuum to one or both of the first roller 23 and the second roller 24 of the conveyor 20 to maintain contact between the photosensitive printing element 14 and the continuous loop 21 of conveyor 20. The vacuum may also be provided to other rollers (not shown) of the conveyor 20.

In another optional, but preferred embodiment, the system 10 may comprise heating means 60 positioned adjacent to a point 70 where the absorbent material 32 contacts the at least one layer of photosensitive material 14 on the conveyor 20. The heating means 60 provides an auxiliary heat source to further soften and liquefy portions of the at least one layer of photosensitive material 14 on the conveyor 20.

It would be apparent to one skilled in the art that the conveyor 20, including first roller 23 and second roller 24 as well as the heatable roller 28 are driven by suitable means, i.e., a motor. In addition, a controller, such as a microprocessor may be used in the system of the invention to control the operation of each of the elements in the plate processor 10. Such controllers are well known in the art. One example of a controller used to control the various elements in a plate processor is described in U.S. Pat. No. 5,279,697 to Peterson et al., the subject matter of which is herein incorporated by reference in its entirety.

The present invention is also directed to a method of forming a relief image on a photosensitive printing element, wherein the photosensitive printing element comprises a flexible substrate and at least one layer of photosensitive material deposited on the flexible substrate using the system described above.

The method comprises the steps of (1) providing an enclosure; (2) positioning a photosensitive printing element on a conveying means, said conveying means comprising a continuous loop supported by at least a first roller and a second roller, wherein the photosensitive printing element is supported on the continuous loop; (3) supplying an absorbent material to at least a portion of an outer surface of a heatable roller that is mounted for rotation in the enclosure, wherein the absorbent material is capable of absorbing material that is liquefied or softened from the photosensitive printing element when the heatable roller is heated and rotates and the absorbent material contacts at least a portion of the photosensitive printing element; (4) heating the heatable roller to a temperature sufficient to cause at least a portion of the at least one layer of photosensitive material to soften or liquefy when the absorbent material contacts the at least one layer photosensitive material; (5) causing a surface of the at least one layer of photosensitive material and the absorbent material to come into contact at a point between the conveying means and the heatable roller such that at least a portion of the liquefied or softened material is absorbed by the absorbent material; and (6) treating and recycling air containing volatile organic compounds in the enclosure, wherein the volatile organic compounds are released into the enclosure as the portion of the photosensitive material is heated and then liquefies or softens.

Preferably, the photosensitive printing element is processed through the steps of the process several times so that most, if not all of the uncured photosensitive material can be removed from the surface of the photosensitive printing element to obtain the relief image.

The air containing volatile organic compounds is treated and recycled by exhausting a flow of air containing the volatile organic compounds and other contaminants from the enclosure; filtering the flow of air to remove particulates and removing volatile organic compounds from the flow of air to produce a purified stream of air; and recycling the purified flow of air back into the enclosure. The volatile organic compounds are typically removed from the air stream by passing the flow of air containing the volatile organic compounds over a bed of adsorbent material, as discussed above.

In a preferred embodiment, the temperature of the flow of air containing the volatile organic compounds introduced into the ventilation means from the enclosure is also controlled.

Through the combined use of a particulate filter and a bed of adsorbent material, organic vapors are removed from the offgas stream, eliminating the need for external ventilation and avoiding the release of organic vapors into the environment.

The system of the invention prevents the buildup of organic vapors and odors inside the thermal plate processor or inside the room in which the processor sits. Additionally the system of the invention eliminates the need for external ventilation of the organic vapor laden processor offgas.

Although the ventilation means of the invention are described for use in the particular application of thermal development of flexographic printing plates, the ventilation means are not limited to this application and may also be usable in other development systems for printing plates and in other applications where the control of organic vapors is desired.

What is claimed is:

1. A system for forming a relief image on a photosensitive printing element, wherein the photosensitive printing element comprises a flexible substrate and at least one layer of photosensitive material deposited on the flexible substrate, the system comprising:
    an enclosure;
    a conveyor comprising a continuous loop wherein the photosensitive printing element is positioned on the continuous loop of the conveyor;
    a heatable element capable of being urged towards the photosensitive printing element positioned on the conveyor, wherein an absorbent material is conducted over at least a portion of an outer surface of the heatable element, and wherein the absorbent material is capable of absorbing material that is liquefied or softened from the photosensitive printing element when the heatable element is heated and the absorbent material contacts at least a portion of the photosensitive printing element;
    means for causing the at least one layer of photosensitive material and the absorbent material to come into contact at a point between the conveyor and the heatable element such that at least a portion of the liquefied or softened material is absorbed by the absorbent material and such that volatile organic compounds are released into the enclosure; and
    ventilation means operatively connected to the enclosure for recycling air containing volatile organic compounds from the enclosure through a treatment means and at least partially back to the enclosure; wherein the treatment means comprises a particulate filter and a means for adsorbing volatile organic compounds.

2. The system according to claim 1, further comprising delivery means for supplying the absorbent material to at least the portion of the outer surface of the heatable element.

3. The system according to claim 1, further comprising heating means for applying heat to the at least one layer of photosensitive material on the conveyor, wherein said heating means are positioned adjacent to a point where the absorbent material contacts the at least one layer of photosensitive material on the conveyor.

4. The system according to claim 1, further comprising means for controlling the temperature of the flow of air containing the volatile organic compounds introduced into the ventilation means from the enclosure.

5. The system according to claim 4, wherein the means for controlling the temperature of the flow of air in the ventilation means comprises a heat exchanger or a hear pump.

6. The system according to claim 1, wherein the means for adsorbing volatile organic compounds comprises a bed of adsorbent material and the flow of air containing the volatile organic compounds is passed over the bed of adsorbent material.

7. The system according to claim 6, wherein the adsorbent material is selected from the group consisting of activated carbon, charcoal, alumina, zeolites, and combinations of the foregoing.

8. The system according to claim 1, wherein the particulate filter is high efficiency particulate air filter.

9. The system according to claim 1, wherein the ventilation means is also used to provide a vacuum in the interior of the continuous loop, wherein said vacuum is used to maintain contact between the photosensitive printing element and the continuous loop.

10. The system according to claim 1, further comprising heating means for applying heat to the at least one layer of photosensitive material on the conveyor, wherein said heating means are positioned adjacent to a point where the absorbent material contacts the at lease one layer of photosensitive material on the conveyor.

11. A method of forming a relief image on a photosensitive printing element, wherein the photosensitive printing element comprises a flexible substrate and at least one layer of photosensitive material deposited on the flexible substrate, the method comprising the steps of:
    providing an enclosure;
    positioning a photosensitive printing element on a conveying means, said conveying means comprising a continuous loop wherein the photosensitive printing element is supported on the continuous loop;
    supplying an absorbent material to at least a portion of an outer surface of a heatable element, said heatable element being mounted in the enclosure, wherein the absorbent material absorbs material that is liquefied or softened from the photosensitive printing element when the heatable element is heated and the absorbent material contacts at least a portion of the photosensitive printing element;

heating the heatable element to a temperature sufficient to cause at least a portion of the at least one layer of photosensitive material to soften or liquefy when the absorbent material contacts the at least one layer of photosensitive material;

causing the surface of the at least one layer of photosensitive material and the absorbent material to come into contact at a point between the conveyor and the heatable element such that at least a portion of the liquefied or softened material is absorbed by the absorbent material and volatile organic compounds are released into the air in the enclosure; and removing air from the enclosure, pumping said air through a treatment means comprising a particulate filter and a means for adsorbing volatile organic compounds, and returning at least a portion of said air to the enclosure.

12. The method according to claim 11, further comprising the step of applying heat to the at least one layer of photosensitive material on the conveyor by positioning a heater adjacent to a point where the absorbent material contacts the at least one layer of photosensitive material on the conveyor.

13. The method according to claim 11, further comprising the step of controlling the temperature of the air being pumped through the treatment means.

14. The method according to claim 13, wherein the temperature of the flow of air being treated and recycled is controlled using a heat exchanger or a heat pump.

15. The method according to claim 11, wherein the volatile organic compounds are removed from the air being pumped through the treatment means by passing the air containing the volatile organic compound over a bed of adsorbent material.

16. The method according to claim 15, wherein the adsorbent material is selected from the group consisting of activated carbon, alumina, zeolites, and combinations of the foregoing.

17. The method according to claim 11, wherein the particulate filter comprises a high efficiency particulate air filter.

18. The method according to claim 11, further comprising the step of applying heat to the at least one layer of photosensitive material on the conveyor by positioning a heater adjacent to a point where the absorbent material contacts the at least one layer of photosensitive material on the conveyor.

* * * * *

UNITED STATES PATENT AND TRADEMARK OFFICE
CERTIFICATE OF CORRECTION

PATENT NO. : 7,152,529 B2  Page 1 of 1
APPLICATION NO. : 11/297725
DATED : December 26, 2006
INVENTOR(S) : Timothy Gotsick It is certified that error appears in the above-identified patent and that said Letters Patent is hereby corrected as shown below:

Column 8

Line 50, delete "lease" and replace it with --least--

Signed and Sealed this

Thirteenth Day of March, 2007

JON W. DUDAS
*Director of the United States Patent and Trademark Office*